(12) United States Patent
Matsudai et al.

(10) Patent No.: US 6,686,613 B2
(45) Date of Patent: Feb. 3, 2004

(54) PUNCH THROUGH TYPE POWER DEVICE

(75) Inventors: Tomoko Matsudai, Tokyo (JP);
Hidetaka Hattori, Yokohama (JP);
Akio Nakagawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/383,515

(22) Filed: Mar. 10, 2003

(65) Prior Publication Data

US 2003/0168718 A1 Sep. 11, 2003

Related U.S. Application Data

(62) Division of application No. 09/961,361, filed on Sep. 25, 2001.

(30) Foreign Application Priority Data

Sep. 28, 2000 (JP) .......................... 2000-297698

(51) Int. Cl.$^7$ .......................... H01L 29/423; H01L 29/45
(52) U.S. Cl. .......................... 257/133; 257/137; 257/146
(58) Field of Search .......................... 257/133, 137, 257/146, 350, 370, 378

(56) References Cited

U.S. PATENT DOCUMENTS

| 4,893,165 A | 1/1990 | Miller et al. |
| 5,466,951 A | 11/1995 | Brunner et al. |
| 5,506,153 A | 4/1996 | Brunner et al. |

(List continued on next page.)

FOREIGN PATENT DOCUMENTS

| JP | 11-274484 | 10/1999 |
| JP | 2000-260788 | 9/2000 |

OTHER PUBLICATIONS

S. Dewar, et al. "Soft Punch Through (SPT)—Setting new Standards in 1200V IGBT" Power Conversion, Jun. 2000, Proceedings, pp. 593–600.

T. Laska, et al. "The Field Stop IGBT (FS IGBT)—A New Power Device Concept with a Great Improvement Potential" IEEE International Symposium on Power Semiconductor Devices & ICs 2000, pp. 355–358.

F. Auerbach, et al. "6,5kV IGBT—Modules" International Power Electronics Conference, IPEC—Tokyo 2000, pp. 275–279.

T. Matsudai, et al. "New 600 V Trench Gate Punch–Through IGBT Concept with Very Thin Wafer and Low Efficiency p–emitter, having an On–state Voltage Drop lower than Diodes" International Power Electronics Conference IPEC—Tokyo 2000, pp. 292–296.

(List continued on next page.)

*Primary Examiner*—John F. Niebling
*Assistant Examiner*—Walter L. Lindsay, Jr.
(74) *Attorney, Agent, or Firm*—Oblon, Spivak, McClelland, Maier & Neustadt, P.C.

(57) ABSTRACT

A negative buffer layer and a positive collector layer are formed on a side of one surface of a semiconductor substrate. The positive collector layer is set to have a low dose amount and set shallow so that a low injection efficiency emitter structure is realized. Break down voltage of a power device is controlled by a thickness of a drift layer. A positive base layer, a negative emitter layer and a positive base contact layer are formed on a side of the other surface of the semiconductor substrate. A negative low resistant layer reduces a junction FET effect. An emitter electrode comes into contact with the negative emitter layer and the positive base contact layer. A collector electrode comes into contact with the positive collector layer. A gate electrode is formed on a gate insulating film above a channel region on a surface portion of the positive base layer.

9 Claims, 15 Drawing Sheets

U.S. PATENT DOCUMENTS

| | | | |
|---|---|---|---|
| 5,925,899 A | | 7/1999 | Nakamura et al. |
| 5,994,739 A | | 11/1999 | Nakagawa et al. |
| 6,303,410 B1 | | 10/2001 | Baliga |
| 6,384,431 B1 | * | 5/2002 | Takahashi et al. .......... 257/147 |
| 6,528,848 B1 | * | 3/2003 | Hoshino et al. ............ 257/339 |
| 6,620,653 B2 | * | 9/2003 | Matsudai et al. ........... 257/133 |

OTHER PUBLICATIONS

F. Bauer et al., "Design Considerations and Characteristics of Rugged Punchthrough (PT) IGBTs with 4.5kV Blocking Capability", IEEE, pp. 327–330.

* cited by examiner

PUNCH THROUGH TYPE POWER DEVICE

CROSS-REFERENCE TO RELATED APPLICATIONS

This application is based upon and claims the benefit of priority from the prior Japanese Patent Application No. 2000-297698, filed Sep. 28, 2000, the entire contents of which are incorporated herein by reference. This application also is a division of application Ser. No. 09/961,361, filed Sep. 25, 2001, the entire contents of which are incorporated herein by reference.

BACKGROUND

The present invention relates to a high voltage semiconductor device, and more particularly, to a power device such as an IGBT.

A conventional high voltage vertical power device will be explained below while taking the case of a punch through type IGBT using an epitaxial substrate.

FIG. 1 is a sectional view of a cell area of the conventional punch through type IGBT using the epitaxial substrate.

The epitaxial substrate comprises a positive semiconductor substrate (positive collector layer) 11 and a negative epitaxial layer formed on the semiconductor substrate 11 by an epitaxial growth method. In this example, the epitaxial layer comprises a negative buffer layer 12 and a N type drift layer (active layer) 13. For example, concentration of positive impurity in the semiconductor substrate 11 is set to about $7.5 \times 10^{18}$ atoms/cm$^3$, concentration in the negative impurity in the buffer layer 12 is set to about $2.7 \times 10^{17}$ atoms/cm$^3$, and concentration of negative impurity in the drift layer 13 is set to about $1.35 \times 10^{14}$ atoms/cm$^3$.

A positive base layer 14 is formed on a surface region of the drift layer 13. A negative emitter layer 15 and a positive base contact layer 16 are formed in the positive base layer 14. A negative low resistant layer 17 which is adjacent to the positive base layer 14 is formed in the drift layer 13.

For example, surface concentration of positive impurity in the positive base layer 14 is set to about $4.0 \times 10^{17}$ atoms/cm$^3$, surface concentration of negative impurity in the negative emitter layer 15 is set to about $1.27 \times 10^{20}$ atoms/cm$^3$, surface concentration of positive impurity in the positive base contact layer 16 is set to about $2.8 \times 10^{19}$ atoms/cm$^3$, and surface concentration of negative impurity in the negative low resistant layer 17 is set to about $5.0 \times 10^{15}$ atoms/cm$^3$.

An emitter electrode 18 is formed on the negative emitter layer 15 and the positive base contact layer 16. The emitter electrode 18 is in contact with the negative emitter layer 15 and the positive base contact layer 16. A gate electrode 20 is formed on the positive base layer 14 through an insulating film 19. A collector electrode 21 is formed on a back surface of the semiconductor substrate 11.

In the conventional power device including the above-described IGBT, an epitaxial substrate is employed. However, manufacturing cost of the epitaxial substrate is high and as a result, a cost of the vertical power device is increased.

In the power device, a so-called life time control is conducted in order to enhance the turn off characteristics. As the life time is shorter, a high speed turn off is possible. Therefore, the life time has been set from a range of 5 to 10 µs to about 100 ns.

However, as is well known, the turn off characteristics and the on characteristics are in a relation of trade-off. That is, if the turn off characteristics is enhanced, ON voltage becomes higher and on characteristics are deteriorated.

This trade-off relation is generated not only in the above-described punch through type device having the buffer layer, but also in a non-punch through type device having no buffer layer and in a trench gate type device.

SUMMARY

A punch through type power device according to aspect of invention comprises: a first conductive type first base layer having first and second surface areas; a second conductive type collector layer whose thickness is set to 1 µm or less, and provided in the first surface area; a first conductive type buffer layer between the first base layer and the collector layer; a second conductive type second base layer in the second surface area; a first conductive type emitter layer in the second base layer; a gate insulating film on the second base layer between the emitter layer and the first base layer; and a gate electrode on the gate insulating film.

DETAILED DESCRIPTION

A semiconductor device and its manufacturing method of the present invention will be explained in detail below with reference to the drawings.

1. FIRST EXAMPLE

Figure 1:
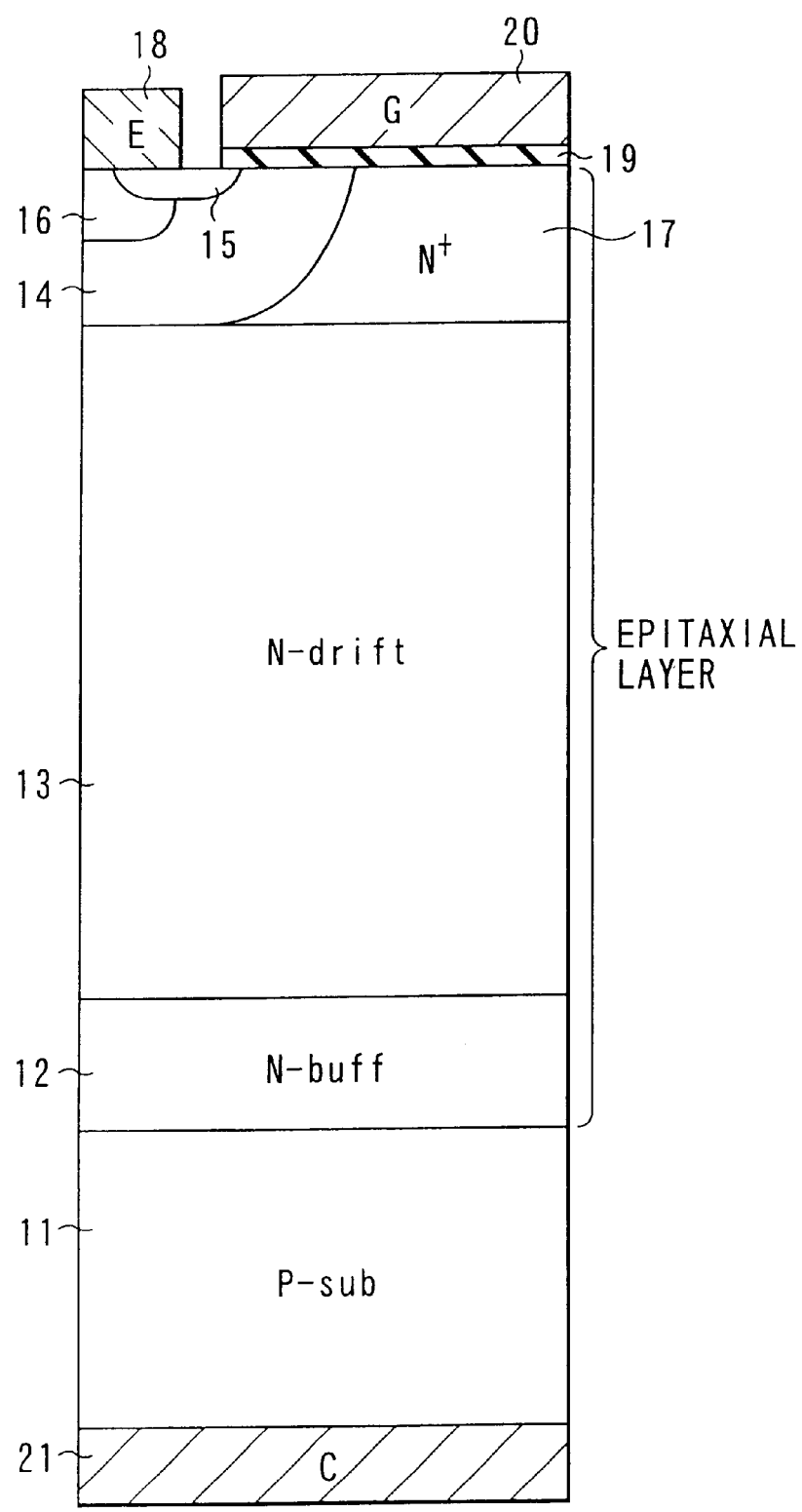
FIG. 1 is a sectional view showing a conventional IGBT.
Figure 2:
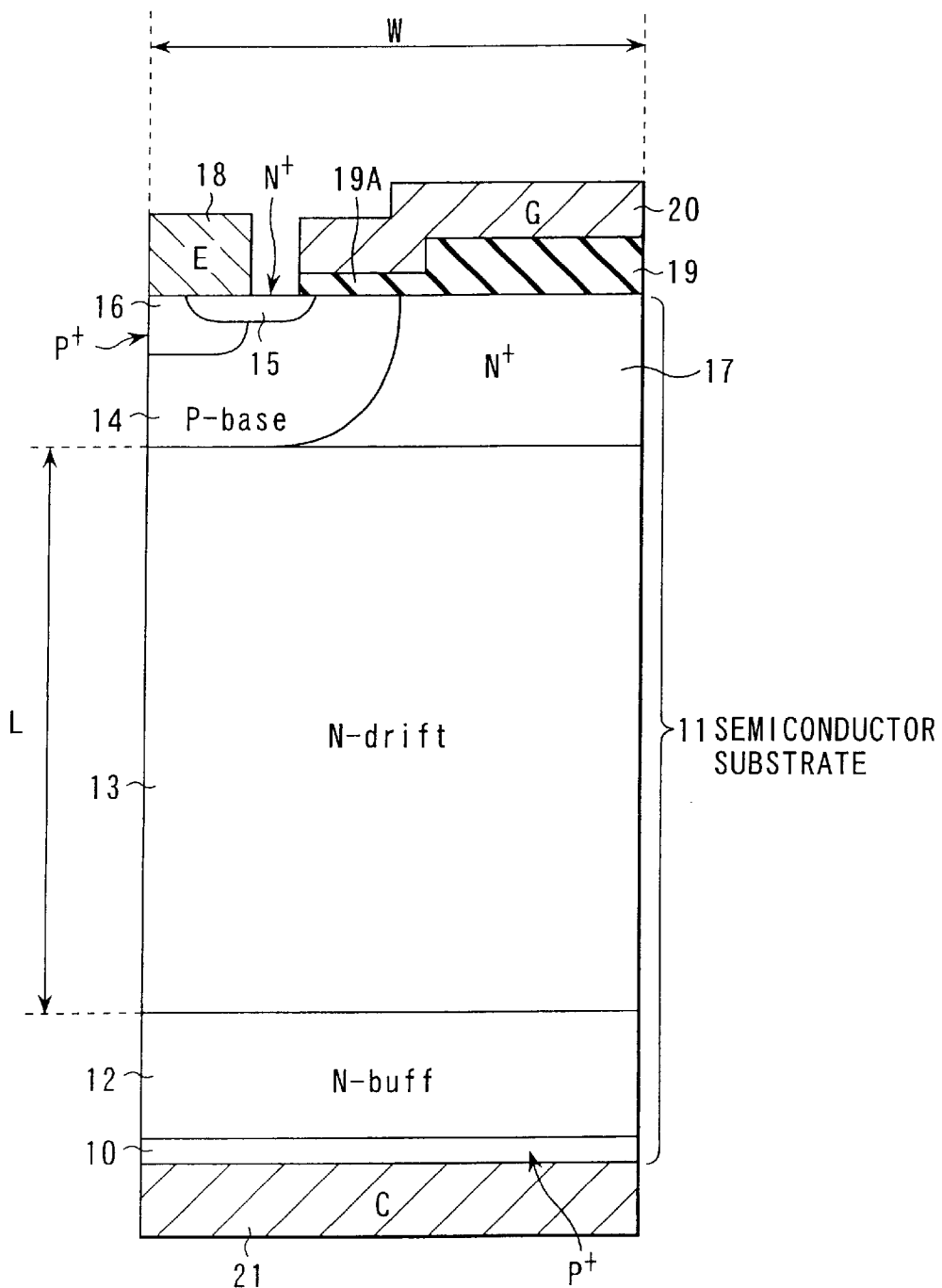
FIG. 2 is a sectional view showing an IGBT according to a first example of the present invention.

FIG. 2 is a sectional view showing a cell area of a punch through type IGBT according to a first example of the present invention.

A vertical power device of this example is characterized in that, firstly, a thickness of a positive emitter layer is thin and a low injection efficiency emitter structure (or a low implantation emitter structure or a transference emitter structure) is employed, and secondary, a breakdown voltage of the vertical power device is adjusted by a thickness of N type drift layer (active layer).

Based on the above characteristics, a concrete structure of the device will be explained.

A positive collector layer (emitter layer) 10 and a negative buffer layer 12 are formed on one surface (back surface) of a negative semiconductor substrate 11. Each of the positive collector layer 10 and the negative buffer layer 12 is formed by implanting impurities into the semiconductor substrate 11 using ion-implantation.

A depth (thickness) of the positive collector layer 10 is set to 1.0 $\mu$m or less, e.g., in a range of 0.1 to 1.0 $\mu$m. A surface concentration of the positive collector layer 10 is set in a range of $2 \times 10^{17}$ atoms/cm$^3$ to $1 \times 10^{20}$ atoms/cm$^3$. An appropriate surface concentration of the positive collector layer 10 depends on a depth of the positive collector layer 10.

By forming the positive collector layer 10 by the ion-implantation of low dose amount, and by reducing the depth of the positive collector layer 10, a low injection efficiency emitter structure can be realized.

The low injection efficiency emitter structure is mainly employed in a non punch through type device having no buffer layer, and has such a motion principle that since implantation amount of holes from the positive collector layer 10 to a N type drift layer (active layer) 13 to holes is small, high speed turn off can be realized.

In the present invention, the low injection efficiency emitter structure is employed so as to enhance the turn off characteristics, it is unnecessary to control the life time unlike the prior art and thus, it is possible to prevent the turn off characteristics from being deteriorated by the life time control.

On the other hand, in order to prevent the vertical power device from being destroyed when reverse bias is applied to the vertical power device, the breakdown voltage of the power device when the device is in the reverse bias state is controlled by the thickness of the N type drift layer (active layer) 13.

For example, if the impurity density of the N type drift layer (active layer) 13 is set to an appropriate value, it is possible to provide a power device having about 10 $\mu$m thickness and having a static breakdown voltage of about 100V. That is, if the thickness of the N type drift layer 13 is set to about 10 $\mu$m, the power device has a static breakdown voltage of about 100V, and if the thickness is set to 20 $\mu$m, the power device has a static breakdown voltage of about 200V. In generally, if the thickness of the N type drift layer 13 is set to 10×I (I is an integer) $\mu$m, the power device has a static breakdown voltage of about (100×I)V.

In the case of a planar type, if 600V is given to the power device, a relation between the thickness L of the N type drift layer 13 and the half cell size W is set such that 6×W is equal to or extremely close to L ideally. That is, in order to provide a power device capable of having a static breakdown voltage of about 600V, since L=60 $\mu$m, the half cell size W is 10 $\mu$m.

In a state in which L=60 $\mu$m is secured, if the half cell size W is set to less than 10 $\mu$m, improvement (reduction of ON voltage) of element characteristic is rated. This is because that since junction FET resistance between gates is increased, even if the half cell size W is reduced excessively, the on voltage is not reduced. That is, even if a pitch of cell is simply reduced to make the device fine, this does not contribute the reduction of on voltage. On the other hand, in the case of on resistance of the IGBT, since a rate occupied by channel resistance is great, to shorten the channel is effective for reducing the on voltage.

Taking the above points into account and in order to prevent the device from being destroyed by shortening the channel, and from a result of simulation, the relation between the thickness L of the N type drift layer 13 and the half cell size W is set to such a value that can satisfy 8×W>L. For example, when a power device has a static breakdown voltage of about 600V, the half cell size W can be reduced to 7.5 $\mu$m.

A thickness of the negative buffer layer 12 is set to about 15 $\mu$m, and a concentration of negative impurity in the buffer layer 12 is set to about $2.7 \times 10^{17}$ atoms/cm$^3$. The thickness of the N type drift layer (active layer) 13 is set to about 52.5 $\mu$m for example, and a concentration of negative impurity in the N type drift layer 13 is set to about $1.35 \times 10^{14}$ atoms/cm$^3$ for example.

A positive base layer 14 is formed in a surface region of the N type drift layer 13. A negative emitter layer 15 and a positive base contact layer 16 are formed in the positive base layer 14. A negative low resistant layer 17 which is adjacent to the positive base layer 14 is formed in the N type drift layer 13.

A depth of the positive base layer 14 is set to about 4.5 $\mu$m, and a surface concentration of positive impurity in the positive base layer 14 is set to about $4.0 \times 10^{17}$ atoms/cm$^3$. A depth of the negative emitter layer 15 is set to about 0.3 $\mu$m, and a surface concentration of negative impurity in the negative emitter layer 15 is set to about $1.27 \times 10^{20}$ atoms/cm$^3$.

A depth of the positive base contact layer 16 is set to about 2.5 μm, and a surface concentration of the positive impurity in the positive base contact layer 16 is set to about $2.8 \times 10^{19}$ atoms/cm$^3$. A depth of the negative low resistant layer 17 is set to about 4.5 μm, and a surface concentration of negative impurity of the negative low resistant layer 17 is set to about $5.0 \times 10^{15}$ atoms/cm$^3$.

An emitter electrode 18 is formed on the negative emitter layer 15 and the positive base contact layer 16. The emitter electrode 18 is in contact with the negative emitter layer 15 and the positive base contact layer 16. A gate electrode 20 is formed on the positive base layer (channel region) 14 through a gate insulating film 19A. A field insulating film 19 having sufficient thickness is formed on the negative low resistant layer 17. A collector electrode 21 is formed on a back surface of the semiconductor substrate 11.

According to the punch through type IGBT of the first example of the present invention, the positive emitter layer is thin, and a low injection efficiency emitter structure is employed. Therefore, in order to enhance the turn off characteristics, it is unnecessary to control the life time unlike the prior art and thus, it is possible to prevent the turn off characteristics from being deteriorated by the life time control.

According to the punch through type IGBT of the first example of the present invention, the breakdown voltage is adjusted by the thickness of the N type drift layer (active layer). The on voltage can be reduced by shortening the channel of the IGBT cell, and if the cell is formed such that 8×W>L is satisfied, the element characteristic can be enhanced (on voltage is reduced) and high voltage operation can be realized at the same time.

2. SECOND EXAMPLE

Figure 3:
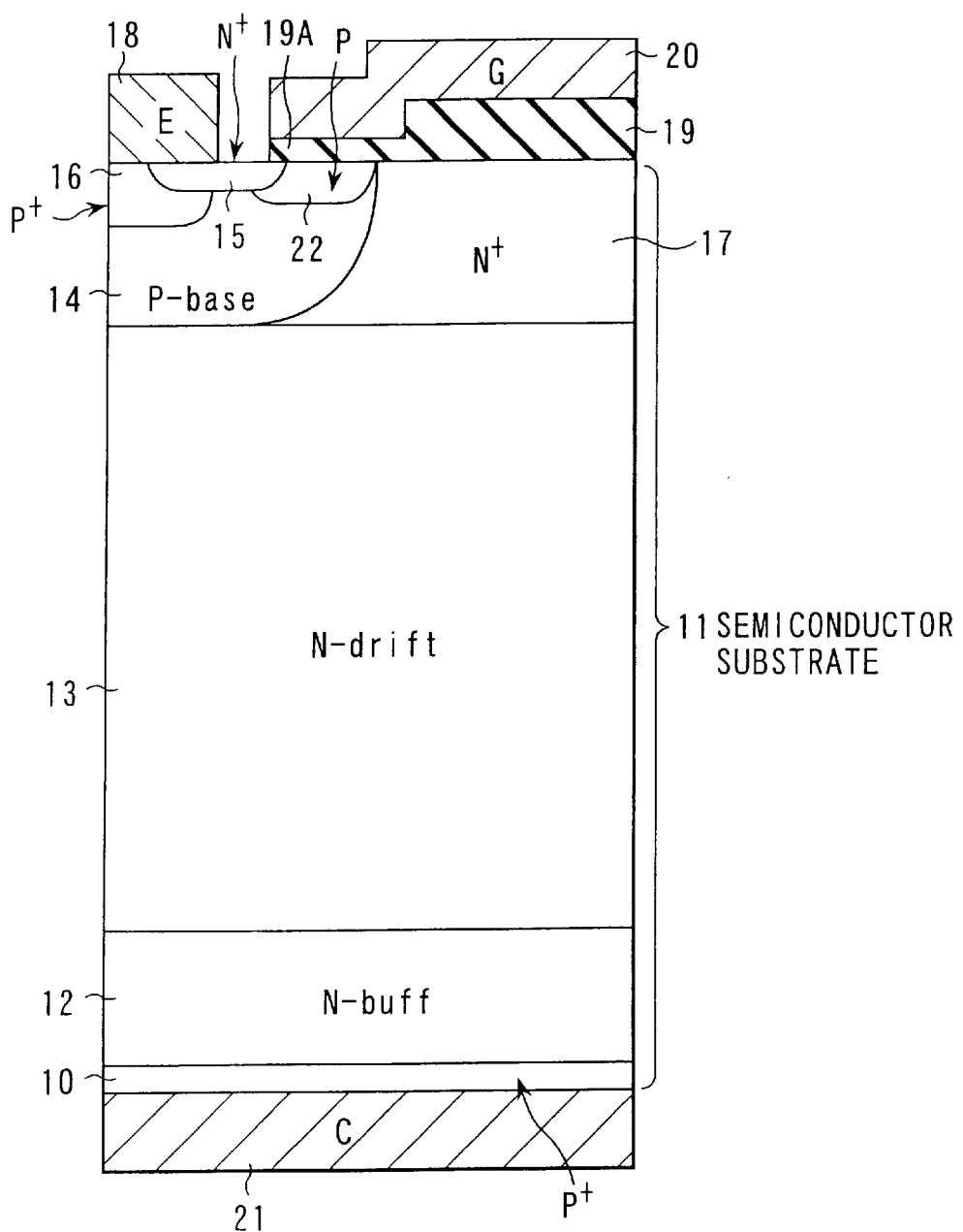
FIG. 3 is a sectional view showing an IGBT according to a second example of the present invention.

FIG. 3 is a sectional view of a cell area of a punch through type IGBT of a second example of the present invention.

A vertical power device of this example is a modification of the punch through type IGBT of the first example, and includes all the characteristics of the punch through type IGBT of the first example.

In addition to the characteristics of the punch through type IGBT of the first example, the vertical power device of the second example is characterized in that a positive impurity layer 22 of IGBT cell is added in order to prevent the destruction when the channel of the IGBT cell is shortened.

For example, when the channel of the IGBT cell is shortened, the channel is prone to be destroyed. Thereupon, in this example, in order to effectively prevent the destruction without changing a threshold value Vth of the IGBT cell, a positive impurity layer 22 is formed on the channel portion of the IGBT cell utilizing a CMOS process. A surface concentration of the positive impurity layer 22 is set to such a value that the threshold value Vt of the MOS transistor is not varied. Here, the CMOS process is a manufacturing process of a power device in which ion is implanted into a channel portion using a mask and then, a gate oxide film and a gate electrode are formed. The reason why this process is called CMOS process is that this process applies a process (generally called "CMOS process") used for manufacturing a complementary CMOS transistor, i.e., a generally CMOS process is applied for manufacturing of a power device in this example.

Figure 4:
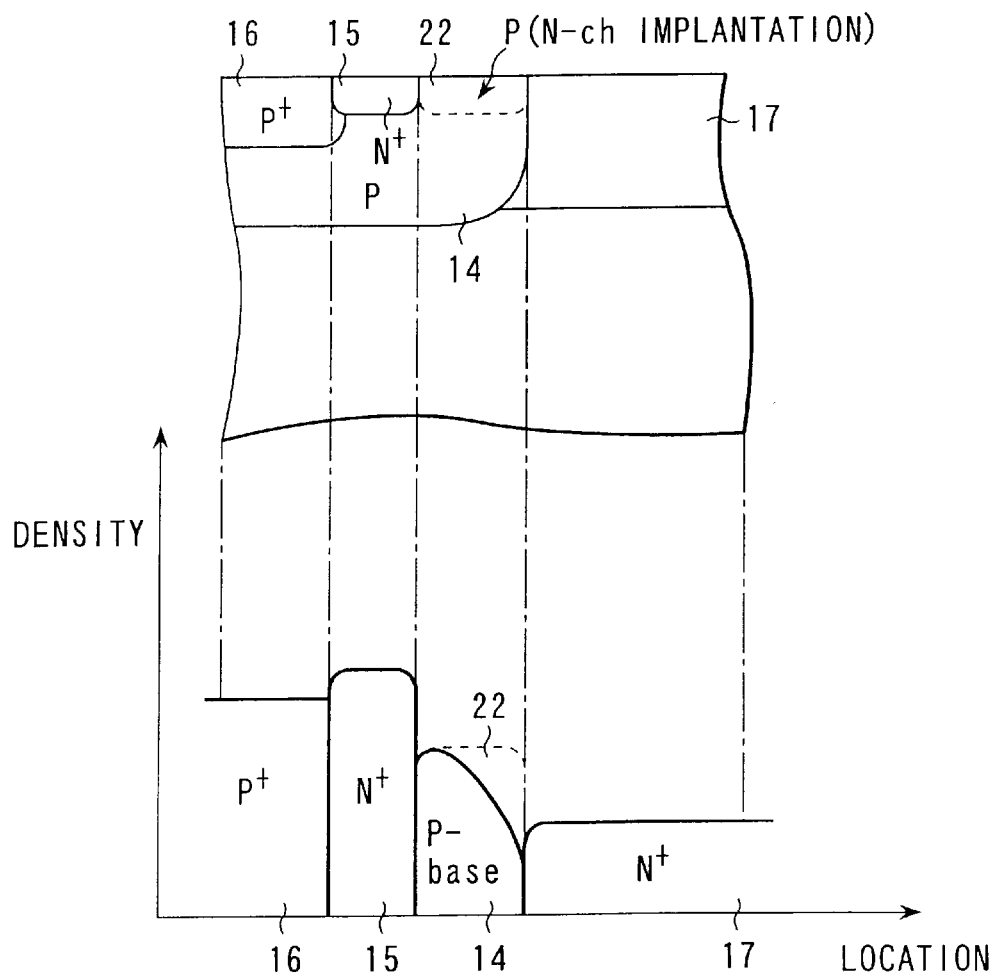
FIG. 4 is a view showing a concentration profile of a surface portion of a device shown in FIG. 3.

FIG. 4 shows a concentration profile of impurity of a surface portion (lateral direction) of the IGBT cell area. In the positive base layer 14 which will become a channel of the IGBT cell, a concentration profile of positive impurity in an end of the positive base layer 14 is not constant and is largely inclined. This is because that the positive base layer 14 is formed by ion-implantation and thermal diffusion. As a result, as the channel of the IGBT cell is shortened, the concentration profile of the channel portion is largely inclined as shown in the drawing (solid line). Element destruction such as punch through is prone to be generated.

Thereupon, in this example, a positive impurity layer 22 is newly formed on the channel portion of the IGBT cell by ion-implantation and thermal diffusion. As a result, the dose amount of the channel portion of the IGBT cell is added, and the concentration profile of the channel portion of the IGBT cell becomes substantially constant (broken line). Therefore, it is possible to prevent the destruction of the element, and to reduce the ion voltage by shortening the channel.

As described above, since the vertical power device of the example has the positive impurity layer 22, the channel resistance can be reduced without changing the threshold value of the IGBT cell, and the on voltage can be reduced. Since a thin semiconductor substrate is used and the low injection efficiency emitter structure is employed in the vertical power device of this example also, it is possible to obtain the effect that the high speed turn off is possible without controlling the life time.

3. THIRD EXAMPLE

Figure 5:
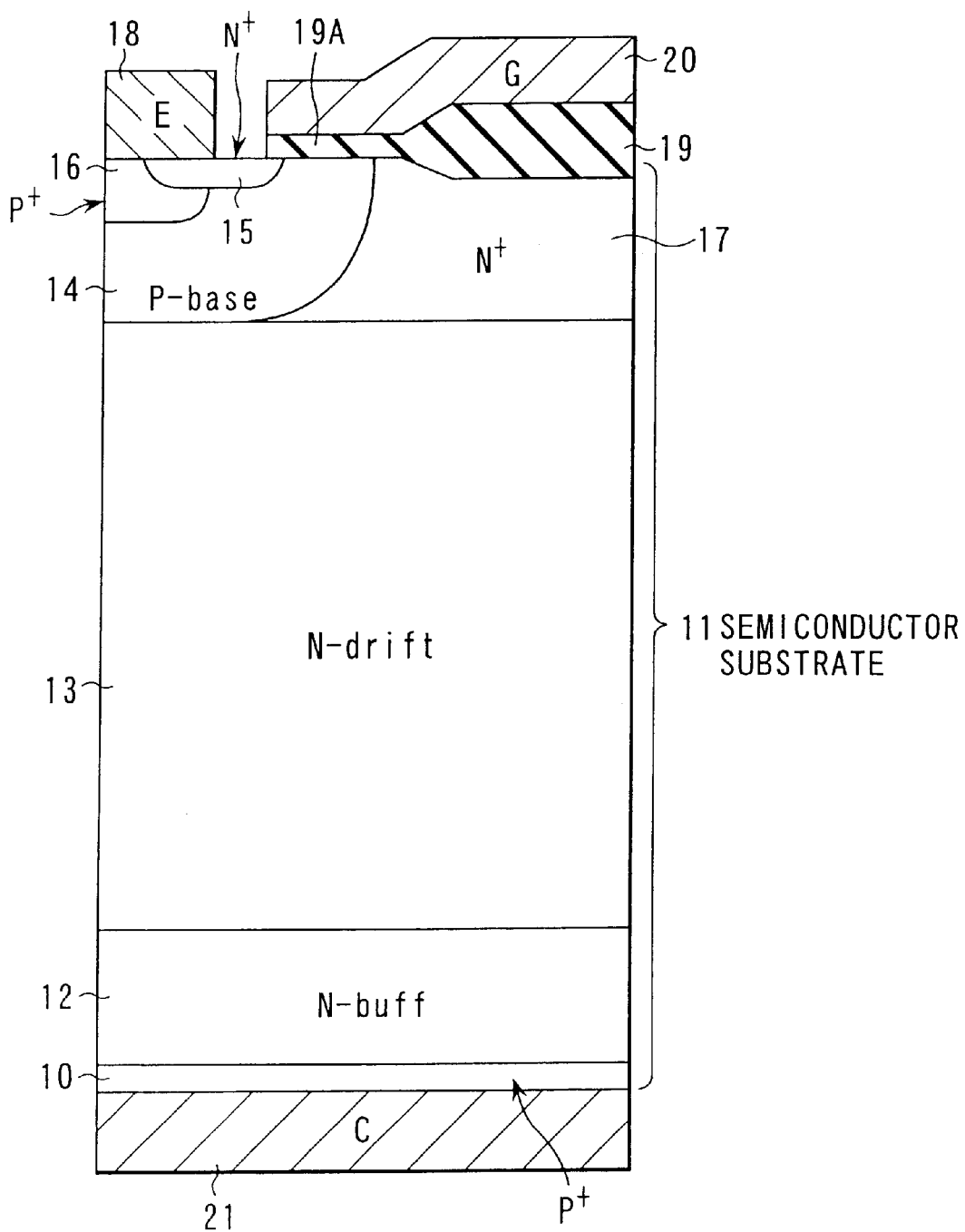
FIG. 5 is a sectional view showing an IGBT according to a third example of the present invention.

FIG. 5 is a sectional view of a cell area of a punch through type IGBT of a third example of the present invention.

A vertical power device of this example is also a modification of the punch through type IGBT of the first example, and includes all the characteristics of the punch through type IGBT of the first example.

In addition to the characteristics of the punch through type IGBT of the first example, the vertical power device of the third example is characterized in that the field insulating film 19 on the negative low resistant layer 17 is formed of an LOCOS oxide film.

For example, in the CMOS process (process used for manufacturing a complementary MOS transistor), the LOCOS oxide film is usually employed for realizing electrical insulation of transistors in the CMOS area. Thereupon, in the vertical power device of this example also, the CMOS process is employed, and electrical isolation of elements using the LOCOS oxide film can be employed.

Since a portion of the LOCOS oxide film enters into the semiconductor substrate 11, and a sufficient thickness can be secured, it is possible to moderate a step on the semiconductor substrate 11. As a result, a wire can be prevented from being cut by the oxide film, and resistance can be prevented from increasing.

In the vertical power device of this example, since the LOCOS oxide film is employed in the field insulating film 19, the step on the semiconductor substrate 11 can be moderated. Since a thin semiconductor substrate is used and the low injection efficiency emitter structure is employed in the vertical power device of this example also, it is possible to obtain the effect that the high speed turn off is possible without controlling the life time.

4. FOURTH EXAMPLE

Figure 6:
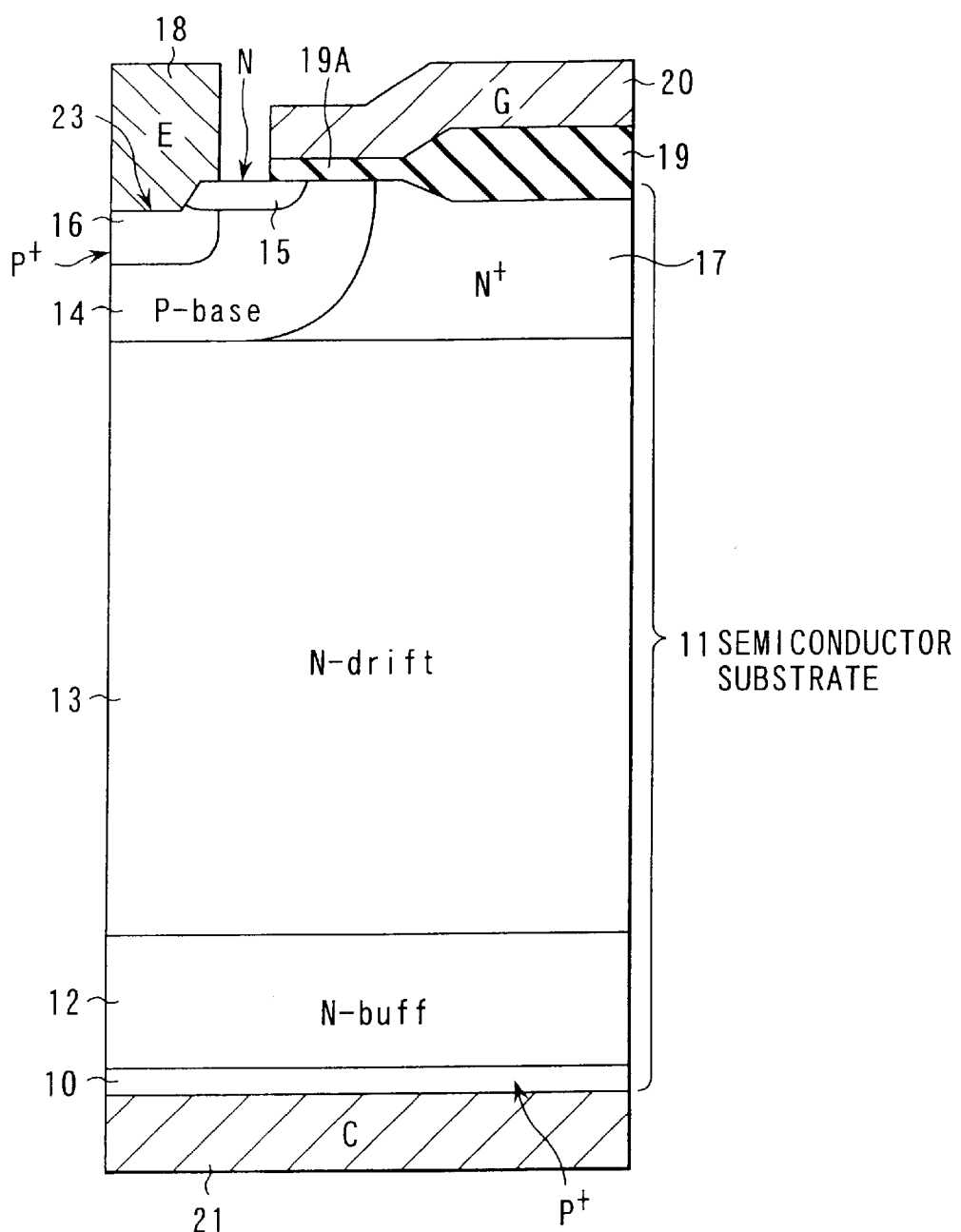
FIG. 6 is a sectional view showing an IGBT according to a fourth example of the present invention.

FIG. 6 is a sectional view of a cell area of a punch through type IGBT of a fourth example of the inventions.

A vertical power device of this example is a modification of the punch through type IGBT of the third example, and includes all the characteristics of the punch through type IGBT of the third example.

In addition to the characteristics of the punch through type IGBT of the third example, the vertical power device of the third example is characterized in that a groove 23 is formed in a surface portion of the positive base contact layer 16 to enhance the turn off characteristics. That is, by forming the groove 23 in the surface portion of the positive base contact layer 16, holes can be discharged smoothly at the time of turn off. Therefore, high speed turn off can be realized.

The groove 23 can be formed using various methods. For example, when the CMOS process explained in the third example is employed, the groove 23 can be formed utilizing a step for forming the LOCOS oxide film.

That is, the LOCOS oxide film 19 is first formed and then, the LOCOS oxide film 19 is etched to form a negative diffusion layer in a peripheral area (region other than a region where IGBT cell is formed). At that time, if an LOCOS oxide film on the positive base contact layer 16 is also etched, the groove 23 is formed.

The CMOS process will be explained later.

In this manner, in the vertical power device of this example, the LOCOS oxide film is employed on the field insulating film 19, and the groove 23 is formed in the surface of the positive base contact layer 16 utilizing the step for forming the LOCOS oxide film. With this method, holes can be discharged smoothly at the time of turn off and therefore, high speed turn off can be realized.

5. FIFTH EXAMPLE

Figure 7:
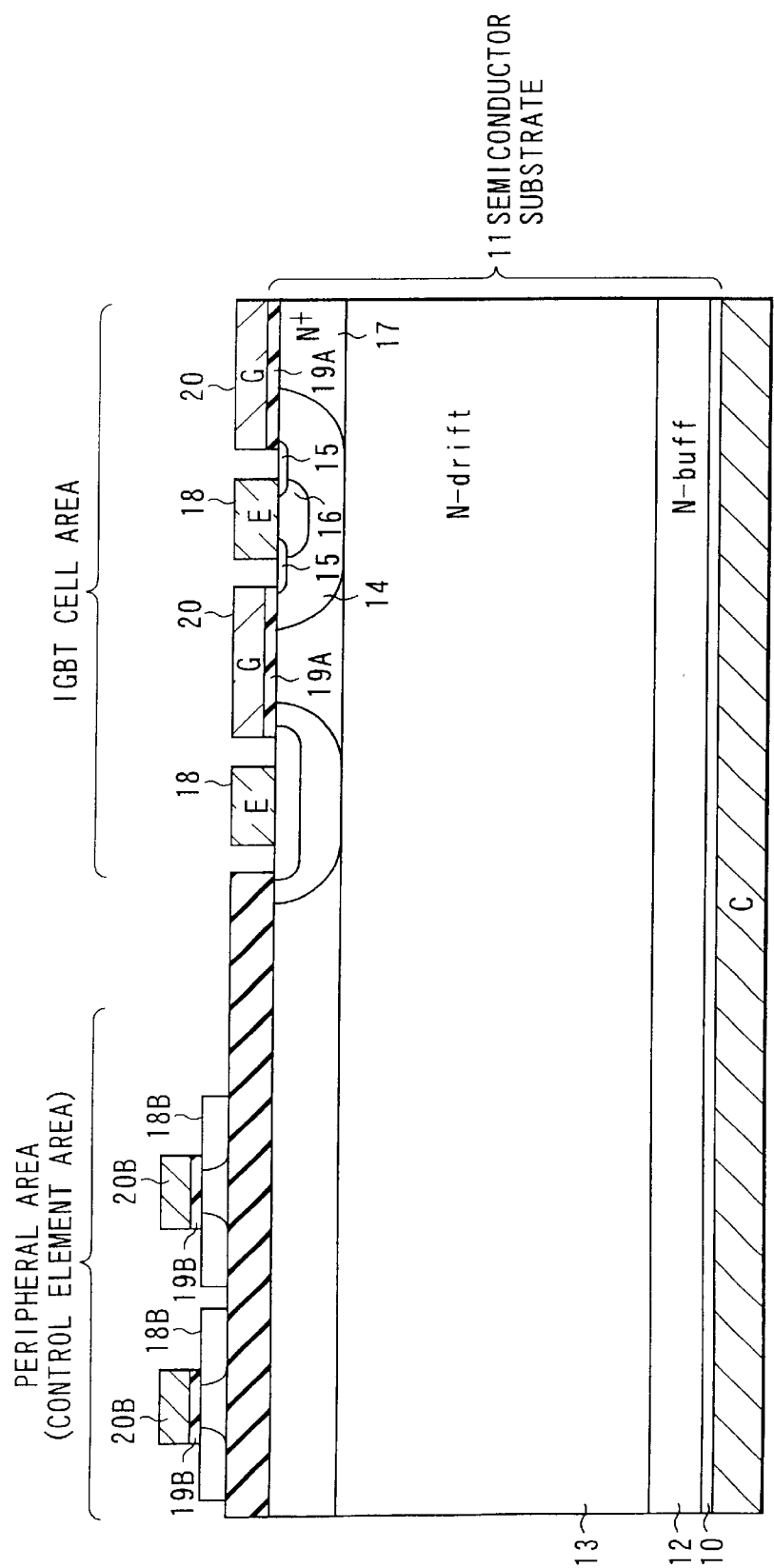
FIG. 7 is a sectional view showing an IGBT according to a fifth example of the present invention.

FIG. 7 is a sectional view of a cell area of a punch through type IGBT of a fifth example of the invention.

A vertical power device of this example is characterized in that a gate insulating film 19A of the IGBT cell area and a gate insulating film 19B of the peripheral area (control element area) are made of the same material at the same time.

That is, the vertical power device includes the IGBT cell area and the peripheral area. The peripheral area is formed with a negative channel MOS transistor and a positive channel MOS transistor for controlling action of the cell of the IGBT cell area.

Therefore, if the CMOS process is employed for manufacturing the vertical power device of this example, the MOS transistor of the peripheral area and the IGBT cell of the IGBT cell area can be formed at the same time.

This example can be applied not only to the punch through type device having the buffer layer, but also to a non-punch through type device or a trench gate type device. This example can be applied to both the vertical power device and a horizontal power device.

A concrete example of a manufacturing method of the power device of this example will be explained below.

Figure 8:
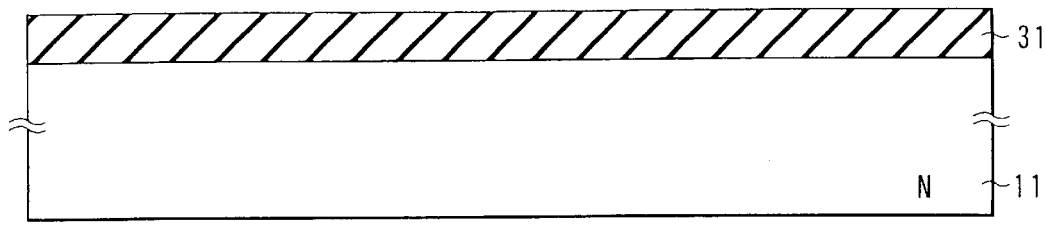
FIG. 8 is a sectional view showing a step of a manufacturing method according to a sixth example of the present invention.

First, as shown in FIG. 8, an oxide film 31 is formed on the negative semiconductor substrate (which will become a N type drift layer 13) 11 by thermal oxidation.

Figure 9:
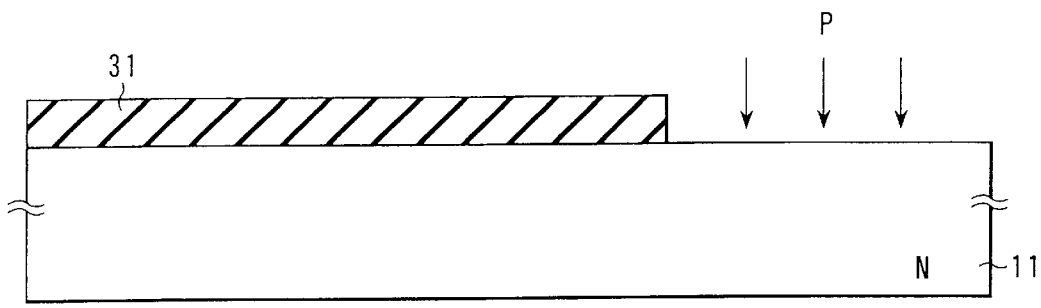
FIG. 9 is a sectional view showing a step of a manufacturing method according to the sixth example of the present invention.

As shown in FIG. 9, a resist pattern is formed on an oxide film 31 by PEP (Photo Engraving Process), this resist pattern is used as a mask and the oxide film 31 of the IGBT cell area is removed by RIE. After the resist pattern was removed, negative impurities (e.g., phosphorus) are implanted into the semiconductor substrate 11 by ion-implantation.

Figure 10:
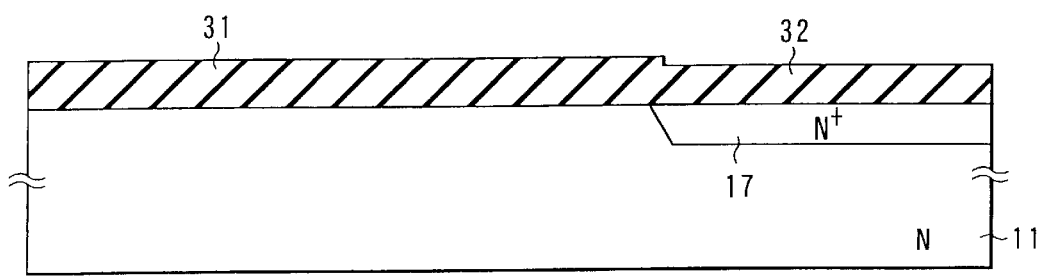
FIG. 10 is a sectional view showing a step of a manufacturing method according to the sixth example of the present invention.

Next, as shown in FIG. 10, an oxide film 32 is formed on the semiconductor substrate 11 again by thermal oxidation. At that time, the negative low resistant layer 17 is formed in the semiconductor substrate 11.

Figure 11:
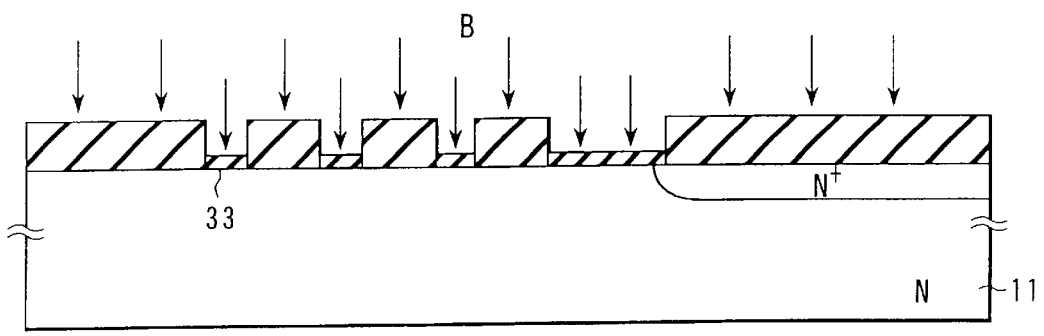
FIG. 11 is a sectional view showing a step of a manufacturing method according to the sixth example of the present invention.

Next, as shown in FIG. 11, a resist pattern is formed on the oxide film 31, and the oxide film 31 of the peripheral area is partially removed using this resist pattern as a mask. Then, the resist pattern is removed, a thin oxide film 33 which suppresses damage at the time of ion-implantation is formed on the exposed semiconductor substrate 11 on the peripheral area. Then, positive impurities (such as boron) are implanted into the semiconductor substrate 11 by ion-implantation.

Figure 12:
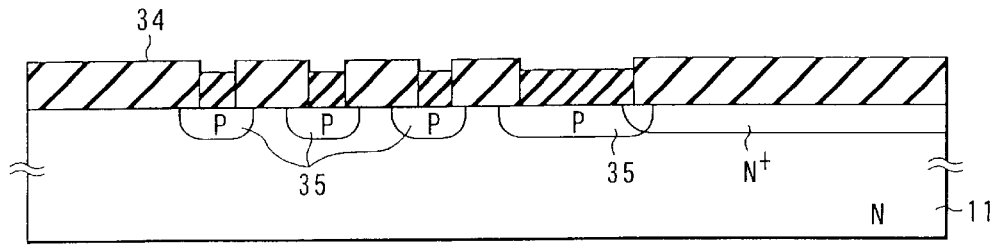
FIG. 12 is a sectional view showing a step of a manufacturing method according to the sixth example of the present invention.

Next, as shown in FIG. 12, a positive impurity layer 35 is formed in the semiconductor substrate 11 by thermal oxidation and diffusion.

Figure 13:
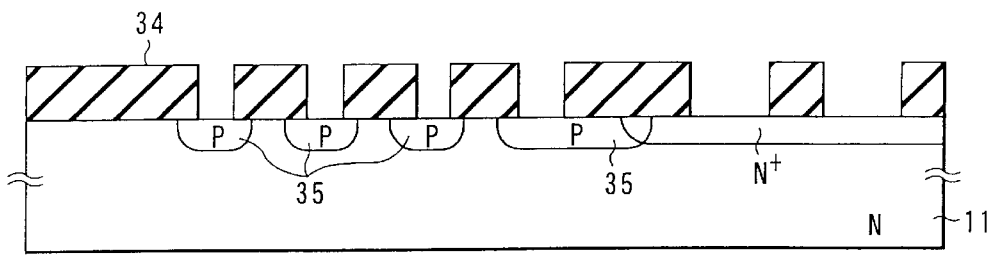
FIG. 13 is a sectional view showing a step of a manufacturing method according to the sixth example of the present invention.

Then, as shown in FIG. 13, a resist pattern is formed on the oxide film 34 by PEP, and the oxide film 34 in the IGBT cell area and the peripheral area is removed using the resist pattern as a mask.

Figure 14:
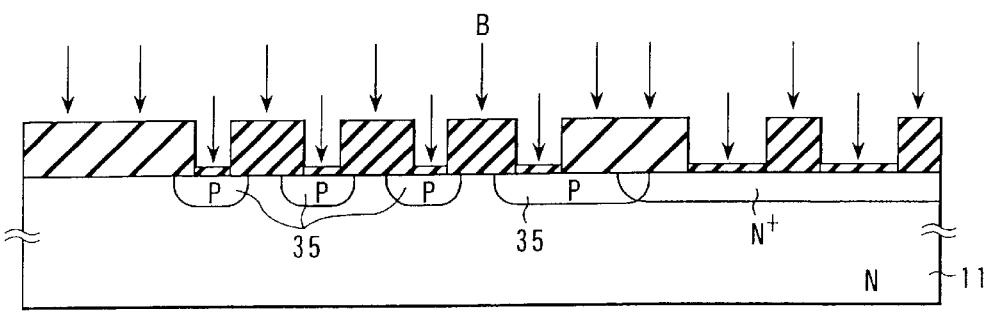
FIG. 14 is a sectional view showing a step of a manufacturing method according to the sixth example of the present invention.

Then, as shown in FIG. 14, the resist pattern is removed, thin oxide film which suppresses damage at the time of ion-implantation is formed on the exposed semiconductor substrate 11 on the IGBT cell area and the peripheral area. Then, positive impurities (such as boron) are implanted into the semiconductor substrate 11 by ion-implantation.

Figure 15:
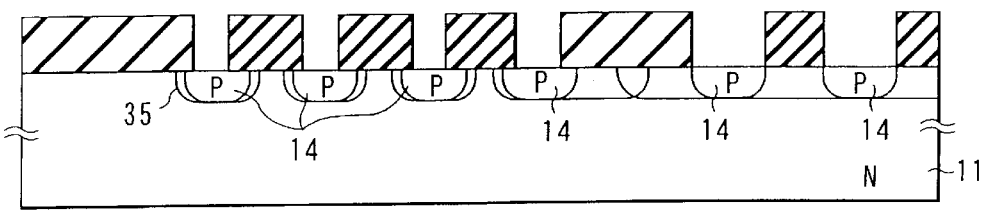
FIG. 15 is a sectional view showing a step of a manufacturing method according to the sixth example of the present invention.

Then, as shown in FIG. 15, the positive impurity layer (positive base layer) 14 is formed in the semiconductor substrate 11 by the thermal oxidation and diffusion.

Next, the oxide film of the IGBT cell area is removed, and thin oxide film which suppresses damage at the time of ion-implantation is formed. Then, positive impurities (such as boron) are implanted into the semiconductor substrate 11 by ion-implantation.

Figure 16:
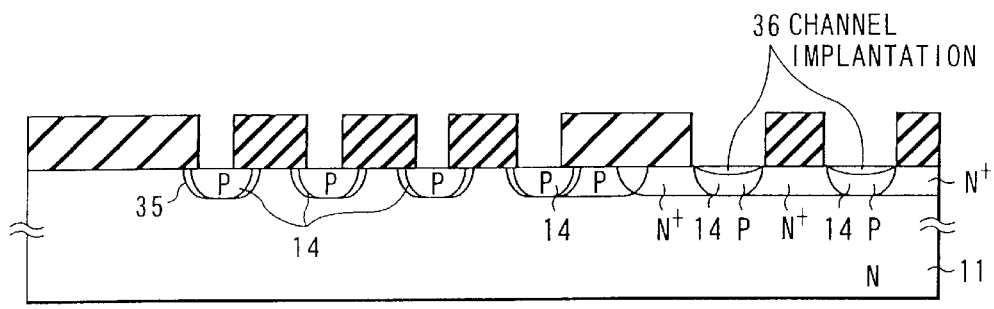
FIG. 16 is a sectional view showing a step of a manufacturing method according to the sixth example of the present invention.

Next, as shown in FIG. 16, a positive impurity layer (so-called negative channel implantation layer) 36 is formed in the semiconductor substrate 11 by thermal oxidation and diffusion.

Figure 17:
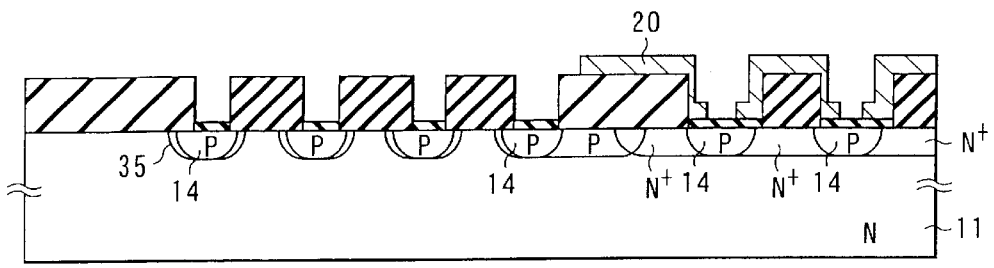
FIG. 17 is a sectional view showing a step of a manufacturing method according to the sixth example of the present invention.

Then, as shown in FIG. 17, a thin oxide film (gate oxide film) is formed on the semiconductor substrate 11 by thermal oxidation.

Thereafter, a polysilicon film is formed on the entire surface. A resist pattern is formed on the polysilicon film by PEP, and the resist pattern is used as a mask to etch the polysilicon film. As a result, the IGBT cell area is formed with a gate electrode 20.

Figure 18:
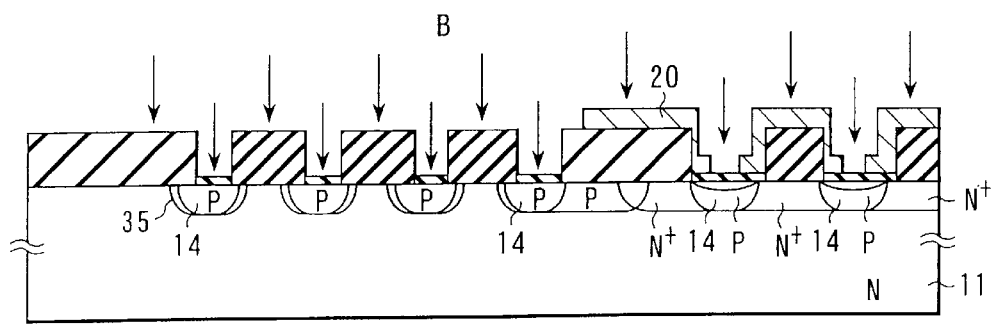
FIG. 18 is a sectional view showing a step of a manufacturing method according to the sixth example of the present invention.

Next, as shown in FIG. 18, using the resist pattern as a mask, positive impurities (e.g., boron) are implanted into the semiconductor substrate 11 by ion-implantation. The, another resist pattern is used as a mask, negative impurities (e.g., arsenic) are implanted into the semiconductor substrate 11 by ion-implantation. At that time, oxide film is peeled off and an oxide film having appropriate thickness is formed before the ion-implantation.

Figure 19:
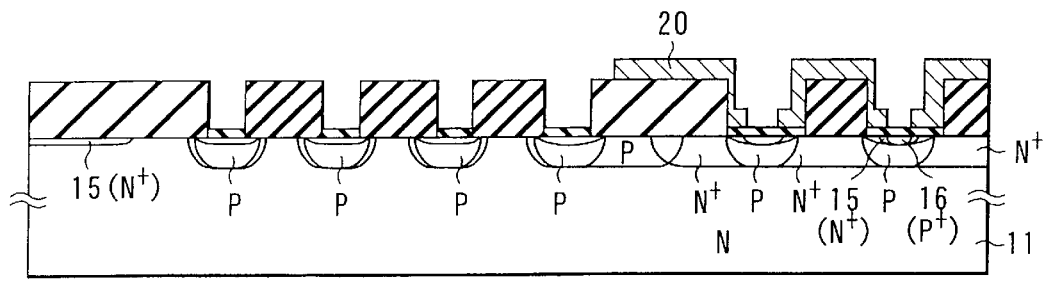
FIG. 19 is a sectional view showing a step of a manufacturing method according to the sixth example of the present invention.

Then, as shown in FIG. 19, the resist pattern is removed and then, thermal diffusion is carried out. As a result, the positive base contact layer 16 and the negative emitter layer 15 are formed in the semiconductor substrate 11.

Figure 20:
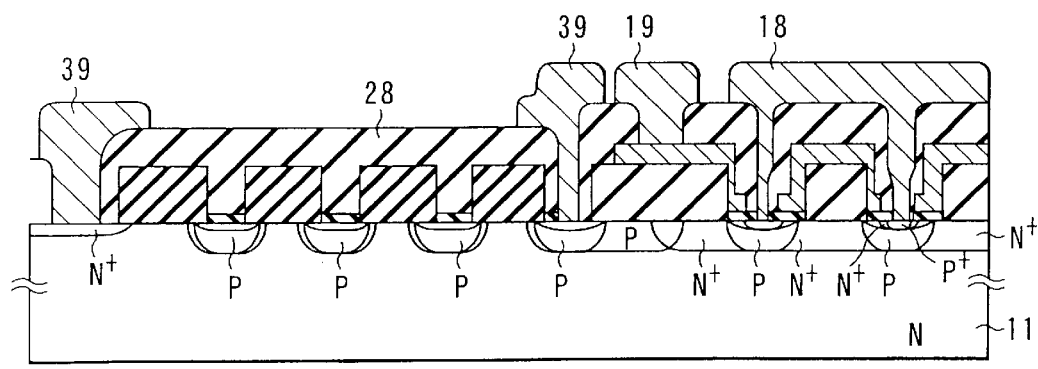
FIG. 20 is a sectional view showing a step of a manufacturing method according to the sixth example of the present invention.

Next, as shown in FIG. 20, an oxide film 28 is formed on the entire surface. A resist pattern is formed on the oxide film 28 by PEP, and the oxide film 28 is etched using the resist pattern as a mask, thereby forming a contact hole. An electrode (e.g., aluminum) is formed on the oxide film 28 and patterning is carried out, the emitter electrode 18 and other electrode 39 are formed.

By carrying out the above steps, a structure of one surface of the vertical power device of the present invention is completed.

A structure of the other surface (back surface) of the vertical power device of the invention can be realized by a step for activating the ion implanted in the semiconductor substrate 11 such as ion-implantation, thermal diffusion or laser annealing. The structure of the back surface can also be realized utilizing the epitaxial substrate.

According to such a manufacturing method, the IGBT cell area and its control circuit (e.g., circuit made of polysilicon) can be formed by the same process (common process) by employing the CMOS process. Therefore, the number of manufacturing steps is not largely increased, and the manufacturing cost can be reduced.

The manufacturing method (CMOS process) according to the present invention can be applied not only the vertical power device, but also to the horizontal power device (e.g., manufacturing method of high voltage IPD (Intelligent Power Device) by SOI-CMOS process in which element separation of LOCOS oxide film).

6. SIXTH EXAMPLE

Figure 21:
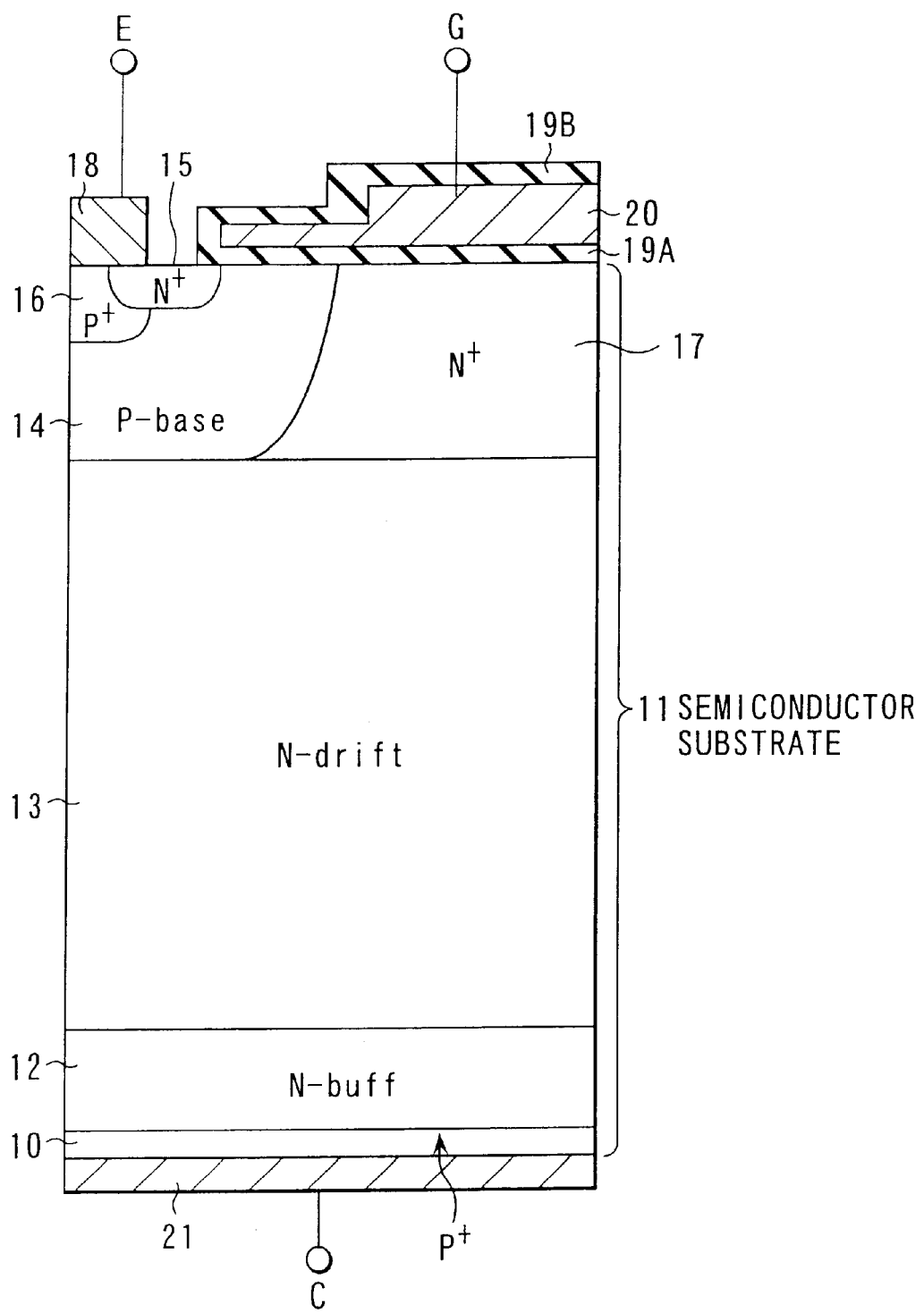
FIG. 21 is a sectional view showing an IGBT according to a seventh example of the present invention.

FIG. 21 is a sectional view of a cell area of a punch through type IGBT of a sixth example of the invention.

The positive collector layer (emitter layer) 10 and the negative buffer layer 12 are formed on one surface (back surface) of the negative semiconductor substrate 11. The positive collector layer 10 and the negative buffer layer 12 are formed by implanting impurities into the semiconductor substrate 11 using ion-implantation.

In the device of this example, a low injection efficiency emitter structure is employed like the device of the first example. That is, a surface concentration of the positive collector layer 10 is set in a range of $1 \times 10^{18}$ atoms/cm$^3$ to $1 \times 10^{20}$ atoms/cm$^3$, and a depth (thickness) of the positive collector layer 10 is set to 0.1 to 1.0 µm.

A thickness of the N type drift layer (active layer) 13 is set to a predetermined value in accordance with voltage (specification). For example, when a power device capable of withstanding 600V, the thickness of the N type drift layer (active layer) 13 is set to about 60 µm.

The positive base layer 14 is formed in a surface region of the N type drift layer 13. The negative emitter layer 15 and the positive base contact layer 16 are formed in the positive base layer 14. The negative low resistant layer 17 which is adjacent to the positive base layer 14 is formed in the N type drift layer 13. The negative low resistant layer 17 is provided for reducing J (junction) FET effect.

The emitter electrode 18 is formed on the negative emitter layer 15 and the positive base contact layer 16. The emitter electrode 18 is in contact with the negative emitter layer 15 and the positive base contact layer 16. The gate electrode 20 is formed on the positive base layer (channel region) 14 through the gate insulating film 19A. The gate electrode 20 is covered with the insulating film 19B. With this short circuit between the emitter electrode 18 and the gate electrode 20 is prevented. The collector electrode 21 is formed on a back surface of the semiconductor substrate 11.

In the above-described IGBT, a negative channel MOS transistor comprises the N type drift layer 13, the positive base layer 14, the negative emitter layer 15, the gate insulating film 19A and the gate electrode 20. If on voltage is applied to the gate electrode 20, a channel is formed in a surface of the positive base layer 14, and electron is implanted into the N type drift layer 13 from the negative emitter layer 15.

Next, operation of the IGBT will be explained.

The turn on operation is as follows.

First, in a state in which collector voltage VCE is applied between the emitter electrode 18 and the collector electrode 21, if a predetermined positive gate voltage (on voltage) VGE is applied between the emitter electrode 18 and the gate electrode 20, the conductive type of the surface region (channel region) of the positive base layer 14 is reversed from positive to negative, and a negative channel is formed. Electrons are implanted from the negative emitter layer 15 to the N type drift layer (base layer) 13 through this channel.

The electron implanted into the N type drift layer 13 is biased through a diode comprising the positive collector layer 10 and the N type drift layer 13 sandwiching the negative buffer layer 12 in the normal direction and thus, holes are implanted into the N type drift layer 13 from the positive collector layer 10 through the negative buffer layer 12.

As a result, resistance of the N type drift layer 13 is largely reduced by the modulation of conductivity, and main current flows between the emitter electrode 18 and the collector electrode 21.

The turn off operation is as follows.

First, potential lower than that of the emitter electrode 18, e.g., negative potential when the potential of the emitter electrode 18 is 0V, is applied to the gate electrode 20. With this, the negative channel (reversed layer) formed on the surface region (channel region) of the positive base layer 14 is eliminated, and the implantation of electrons from the negative emitter layer 15 to the N type drift layer (base layer) 13 is stopped.

As a result, a portion of holes accumulated in the N type drift layer 13 is discharged into the emitter electrode 18 through the positive base layers 14 and 16, and a portion of remaining holes is coupled to the electron again. Therefore, the main current flowing between the emitter electrode 18 and the collector electrode 21 is cut off.

As shown in equation (1), the current amplification factor hFE is defined as being a value obtained by subtracting electron current Ie from collector current Ic.

$$hFE = Ic/Ie \tag{1}$$

In this case, the present inventor found that a maximum value of the current amplification factor hFE is varied by a dose amount of the negative buffer layer 12 and its thickness and by a dose amount of the positive collector layer 10 and its thickness, and that the maximum value of the current amplification factor hFE is closely related to fall time tf.

This point will be explained in detail below.

Figure 22:
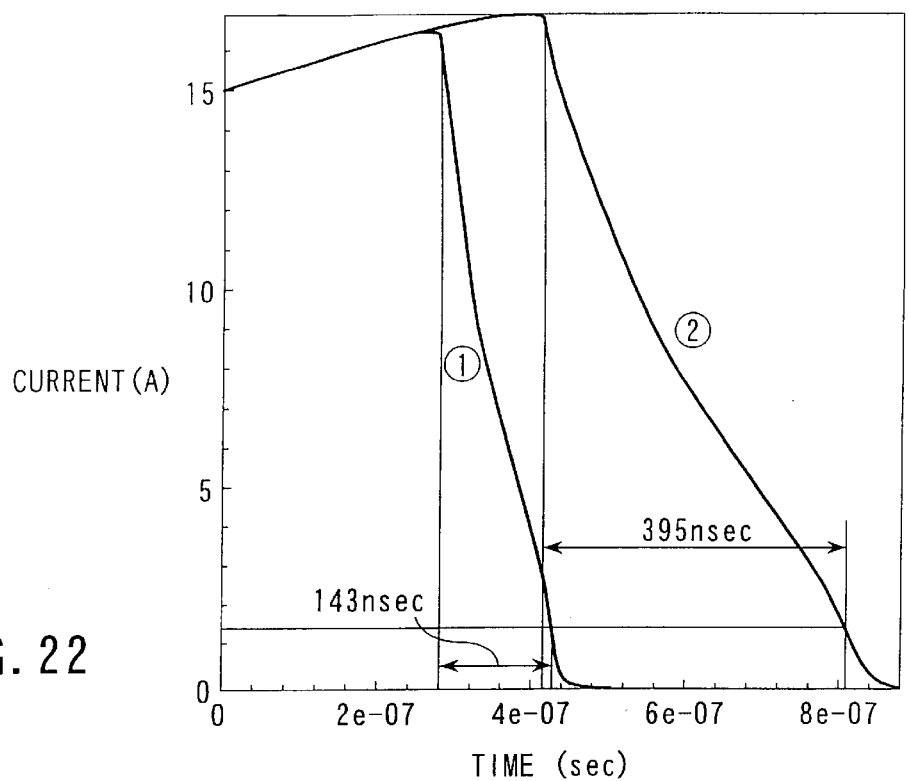
FIG. 22 is a view showing a current waveform at the time of turn off.

FIG. 22 shows a current waveform at the time of turn off, a vertical axis shows current value, and a lateral axis shows time.

A current waveform ① is of a device in which a thickness of a negative buffer layer is set to 1.2 µm, its dose amount is set to $1.8 \times 10^{13}$ atoms/cm$^3$, a thickness of a positive collector layer is set to 0.3 µm, and its dose amount is set to $6.2 \times 10^{13}$ atoms/cm$^3$.

A current waveform ② is of a device in which the thickness of the negative buffer layer is set to 1.2 µm, its dose amount is set to $1.8 \times 10^{13}$ atoms/cm$^3$, the thickness of the positive collector layer is set to 0.3 µm and its dose amount is set to $2.2 \times 10^{14}$ atoms/cm$^3$.

That is, the ① and ② show current waveforms of two kinds of device in which the thickness and the dose amount of the negative buffer layer and the thickness of the positive collector layer are fixed, and the dose amount of the positive collector layer is varied.

From FIG. 2, if a fall time tf of each device is obtained, tf=143 nsec in the case of ① (when the dose amount of the positive collector layer is $2.2 \times 10^{14}$ atoms/cm$^3$), and tf=395 nsec in the case of ② (when the dose amount of positive collector layer is $6.2 \times 10^{13}$ atoms/cm$^3$).

As described above, it is found that the fall time tf is varied depending upon variation of the dose amount of the positive collector layer. A cause of variation in the fall time tf depending upon the variation of the dose amount of the positive collector layer will be explained below.

Figure 23:
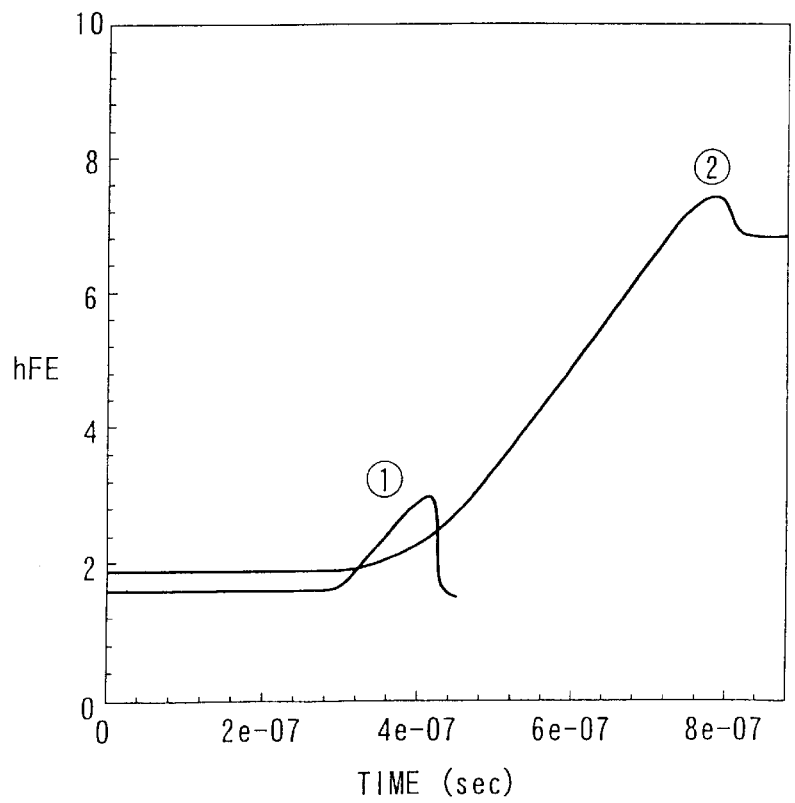
FIG. 23 is a view showing a current amplification factor (current gain) at the time of turn off.

FIG. 23 shows transition with time of the current amplification factor hFE at the time of turn off, a vertical axis shows the current amplification factor hFE and a horizontal axis shows time.

Here, ① is a waveform when a condition is the same as that of the current waveform of ① in FIG. 22, ② is a waveform when a condition is the same as that of the current waveform of ② in FIG. 22. That is, the waveform of ① shows a case in which the dose amount of the positive collector layer is 6.2×10$^{13}$ atoms/cm$^3$, and the current waveform of ② shows a case in which the dose amount of the positive collector layer is 2.2×10$^{14}$ atoms/cm$^3$. The horizontal axis (time) in FIG. 23 corresponds to that shown in FIG. 22.

From FIG. 22, it is found that when the current value is substantially constant (near 15A in FIG. 22), the current amplification factors hFE of ① and ② are substantially constant, and there is almost no difference between the current amplification factor hFE of ① and the current amplification factor hFE of ②.

However, if the reduction of current value is started by the turn off operation, the current amplification factor hFE is gradually increased. If the variation the current amplification factor hFE is compared between the ① and ②, it is found that the current amplification factor hFE of ② having long fall time tf (or turn off period) is greater than the current amplification factor hFE of ① having short fall time tf (or turn off period).

That is, the maximum value of the current amplification factor hFE of ① is about three, the maximum value of the current amplification factor hFE of ② is about eight.

Further, electron current during turn off process when the current amplification factor hFE becomes the maximum value is small as compared with electron current at the normal time, but if the maximum value of the current amplification factor hFE becomes about eight like the case of ②, the collector current Ic becomes eight times greater then the electron current Ie, which is a cause of elongating the turn off period.

The relation between the maximum value of the current amplification factor hFE and the fall time tf (or turn off period) will be explained in more detail.

Figure 24:
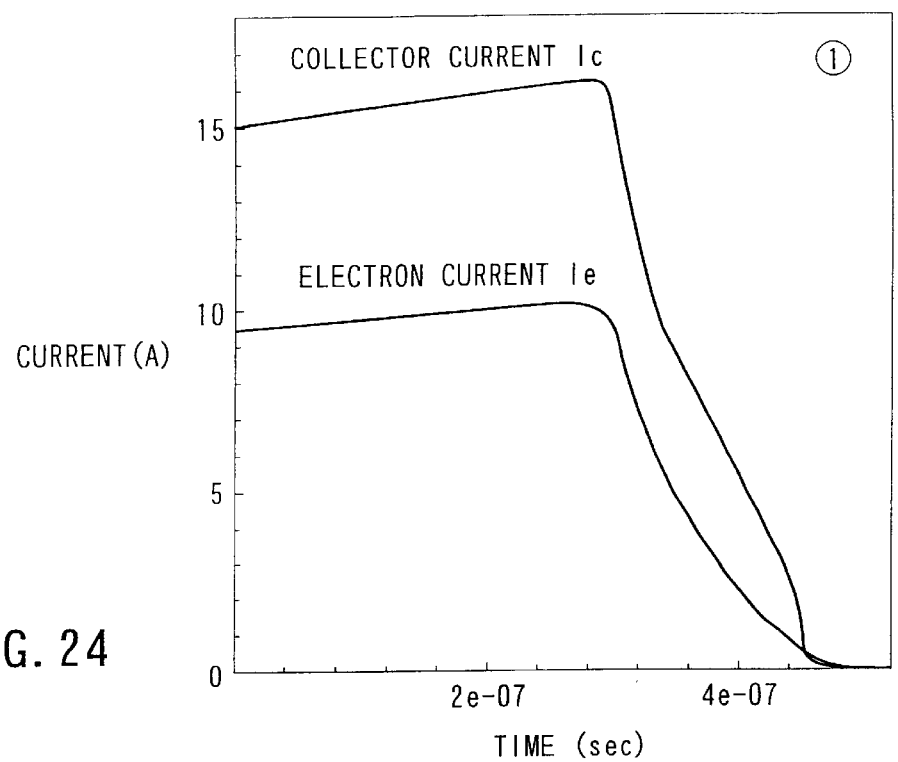
FIG. 24 is a view showing a relation between electron current and collector current at the time of turn off.
Figure 25:
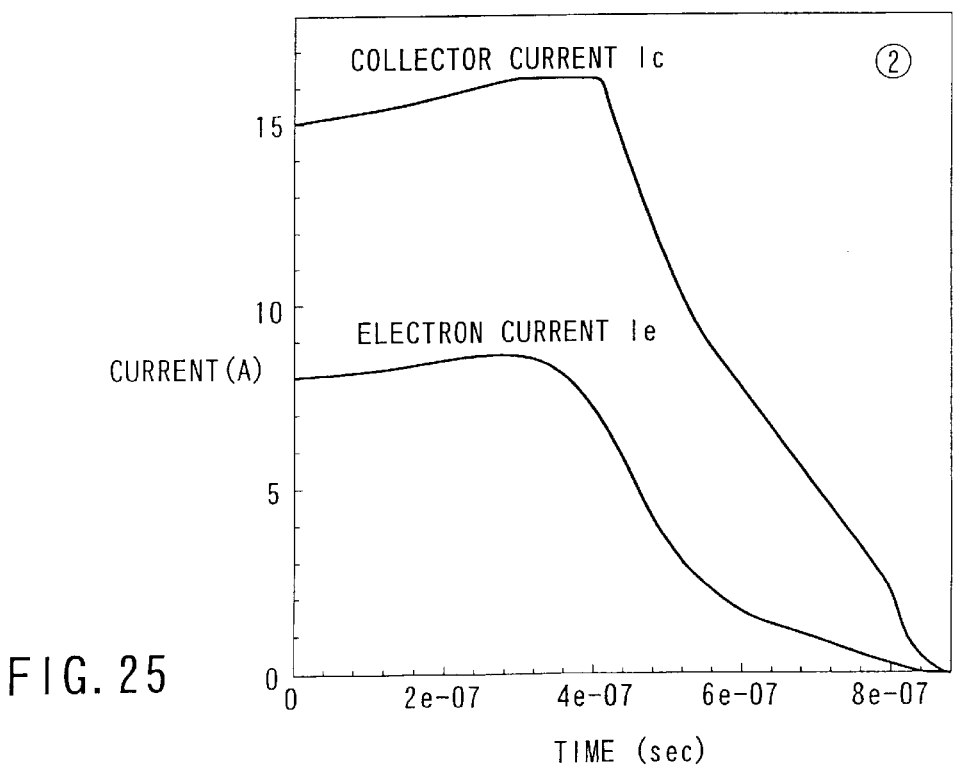
FIG. 25 is a view showing a relation between electron current and collector current at the time of turn off.

FIGS. 24 and 25 show current waveforms of the electron current Ie and the collector current Ic at the time of turn off. In each the drawing, the vertical axis shows a current value and horizontal axis shows time.

FIG. 24 shows waveform corresponding to the condition of ① shown in FIGS. 22 and 23, and FIG. 25 shows waveform corresponding to condition of ② shown in FIGS. 22 and 23. The horizontal axes of FIGS. 24 and 25 correspond to horizontal axes (time) in FIGS. 22 and 23.

A variation range of the current amplification factor hFE of ① is about 1.6 to 3 (maximum value 3 is generated in a tail portion of current waveform, i.e., near 420 nsec) as shown in FIG. 23. An amplification ratio of the collector current Ic to the electron current Ie is relatively small as shown in FIG. 24, and as a result, the fall time tf (or turn off period) can be shortened as shown in FIG. 22.

Whereas, a variation range of the current amplification factor hFE of ② is about 1.8 to 8 (maximum value 8 is generated in a tail portion of current waveform, i.e., near 800 nsec) as shown in FIG. 23. An amplification ratio of the collector current Ic to the electron current Ie is relatively great as shown in FIG. 25, and as a result, the fall time tf (or turn off period) can be largely elongated.

As explained above, it is found that during the turn off process, the maximum value of the current amplification factor hFE is varied depending upon the dose amount of the positive collector layer, and this current amplification factor hFE is closely related to the fall time tf (or turn off period).

Here, in the power device including IGBT shown in FIG. 21, it is required to shorten the fall time tf to a constant value or less. In generally, it is required that the fall time tf is near 200 nsec or less. This is because that by setting the fall time tf to that value, turn off loss (turn off power dissipation) Eoff can be reduced (1 mJ or lower value).

The present inventor studied the best value of the current amplification factor hFE at the time of turn off using simulation results. As a result, the inventor found that if the current amplification factor hFE at the time of turn off is set to 5 or less, the above-described requirement is satisfied.

That is, if the power device is manufactured such as to satisfy the condition that the current amplification factor hFE at the time of turn off is 5 or less, the fall time tf can be set to a sufficient short value (e.g., near 200 nsec or shorter), and the turn off loss Eoff can be sufficiently reduced (e.g., 1 mJ or lower).

Next, a way for manufacturing a power device which satisfies the condition that the current amplification factor hFE at the time of turn off is 5 or less will be explained.

In the above-described simulation, in the punch through type IGBT, the dose amount and thickness of the negative buffer layer and the thickness of the positive collector layer were fixed, and the dose amount of the positive collector layer was varied.

However, as a result of more detailed study, it was found that the current amplification factor hFE at the time of turn off is varied depending upon the dose amount and the thickness of the negative buffer layer as well as the dose amount and the thickness of the positive collector layer.

Grounds of this will be explained below.

The current amplification factor hFE can be expressed in the following equation (2) under the conditions that the life time is sufficiently long (1 μs to 10 μs), the dose amount of the negative buffer layer is defined as QN, the average of the diffusion coefficient in the negative buffer layer is defined as bDN, the dose amount of the positive collector layer is defined as QP, and the average of diffusion coefficient in the positive collector layer is defined as bDP.

$$hFE = bDP \cdot QP / bDN \cdot QN \tag{2}$$

Figure 26:
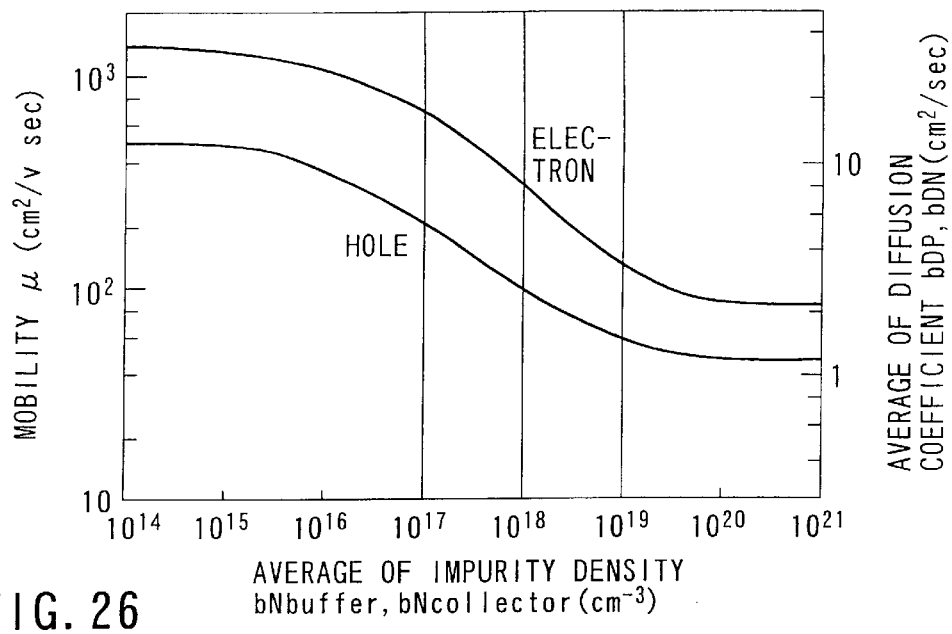
FIG. 26 is a view showing a relation between average of impurity density and average of diffusion coefficient.

Here, there is a constant relation as shown in FIG. 26 between the average bNbuffer of the impurity density in the negative buffer layer and the average bDN of the diffusion coefficient, and between the average bNcollector of impurity density in the positive collector layer and the average bDP of the diffusion coefficient.

Further, the average bNbuffer of the impurity density in the negative buffer layer and the average bNcollector of the impurity density in the positive collector layer can be expressed by the equations (3a) and (3b).

$$bNbuffer = \frac{QN}{WN} \tag{3a}$$

$$QN = \int_0^{WN} Nbuffer(x)dx$$

$$bNcollector = \frac{QP}{WP} \quad (3b)$$

$$QP = \int_0^{WP} Ncollector(x)dx$$

Here, WN represents a thickness of the negative buffer layer, WP represents a thickness of the positive collector layer, Nbuffer(x) represents concentration profile of the negative buffer layer in its depth direction (direction x), and Ncollector(X) represents a concentration profile of the positive collector layer in its depth direction (direction x).

That is, according to the relations shown in the equations (2), (3a) and (3b), the current amplification factor hFE at the time of turn off can be controlled by the dose amount QN (or concentration profile Nbuffer(x)) and thickness WN of the negative buffer layer, and the dose amount QP (or concentration profile Ncollector(x)) and the thickness WP of the positive collector layer.

It was confirmed that the two cases (①and ②) in the above simulation result also satisfied the equations (2), (3a) and (3b).

Therefore, the dose amount and the thickness of the negative buffer layer and the dose amount and the thickness of the positive collector layer are determined such as to satisfy the condition that the current amplification factor hFE at the time of turn off is five or less, and a power device is manufactured, the fall time tf can be sufficiently shortened, and the turn off loss Eoff can be made small sufficiently.

When at least one of the dose amount and the thickness of the negative buffer layer and the dose amount and the thickness of the positive collector layer is determined, other values which are not yet determined can be determined such as to satisfy the condition that the current amplification factor hFE at the time of turn off is five or less.

For example, when the dose amount QN of the negative buffer layer is determined (e.g., a peak value of the concentration profile Nbuffer(x) is set to $5 \times 10^{16}$ atoms/cm$^3$ or higher), the thickness WN of the negative buffer layer or the dose amount QP and thickness WP of the positive collector layer can be determined.

When the thickness of the semiconductor substrate (wafer) is determined (e.g., about 70 µm or less), this value is taken into account and the thickness of the negative buffer layer and the thickness of the positive collector layer can be determined.

Figure 27:
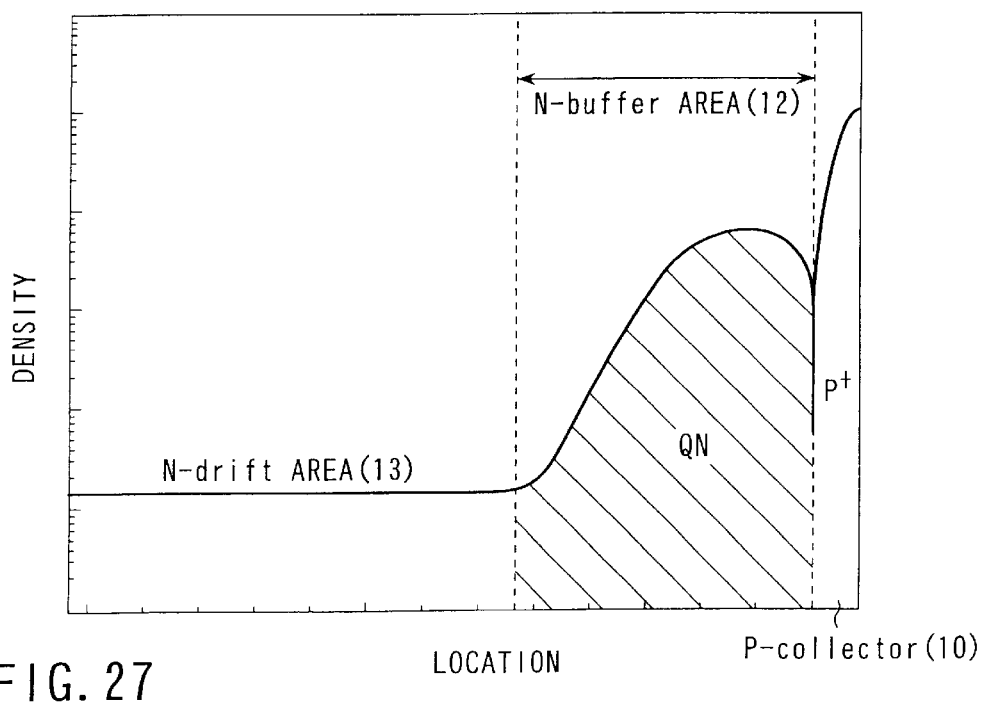
FIG. 27 is a view showing one example for obtaining dose amount of negative buffer layer.

When the dose amount QN of the negative buffer layer is determined, determination is made in accordance with the following definition. That is, as shown in FIG. 27, the area of the negative buffer layer 12 is first defined from a boundary between the positive collector layer 10 and the negative buffer layer 12 to a boundary between the negative buffer layer 12 and the N type drift layer 13. The boundary between the negative buffer layer 12 and the N type drift layer 13 is set to a point where the concentration of negative impurity is substantially constant. Then, the dose amount QN of the negative buffer layer is defined as meaning the dose amount of the negative impurity in the negative buffer layer 12 which was defined above.

In the first to sixth examples, the conductive type of each of the layers constituting the power device is only one example, and the effect of the present invention can of course be obtained even in a device having the reversed conductive type of each layer for example.

As explained above, according to the present invention, firstly, the thin positive collector layer of low dose amount is formed by ion-implantation, and pressure resistance is secured by the N type drift layer. Therefore, low manufacturing cost can be realized, and the off characteristic can be enhanced without deteriorating the on characteristic.

Secondary, since the CMOS process is employed to manufacture the power device, the cell area and the control section can be formed using the same process, the number of manufacturing steps (or the number of PEPs) and thus, the low manufacturing cost can be realized.

Thirdly, the dose amount and the thickness of the negative buffer layer and the dose amount and the thickness of the positive collector layer are determined such that the current amplification factor at the time of turn off becomes five or less. Therefore, the fall time can be shortened sufficiently, and the turn off loss can be made small sufficiently.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A punch through type power device comprising:
   a first conductive type first base layer having first and second surface areas;
   a second conductive type collector layer whose thickness is set to 1 µm or less, and provided in the first surface area;
   a first conductive type buffer layer between the first base layer and the collector layer;
   a second conductive type second base layer in the second surface area;
   a first conductive type emitter layer in the second base layer;
   a gate insulating film on a side of the second base layer between the emitter layer and the first base layer; and
   a gate electrode on the gate insulating film.

2. The punch through type power device according to claim 1
   wherein each of the collector layer, the second base layer and the emitter layer comprises a diffusion layer.

3. The punch through type power device according to claim 1
   further comprising a second conductive type impurity layer disposed in the second base layer alongside of the gate insulating film.

4. The semiconductor device according to claim 1
   wherein the second base layer between the emitter layer and the first base layer becomes a channel region.

5. The semiconductor device according to claim 1
   wherein the second base layer has a groove, and the emitter layer is disposed along an edge of the groove.

6. The semiconductor device according to claim 1
   further comprising a first conductive type low resistant layer in the first base layer adjacent to the second base layer and having a resistant value lower than that of the first base layer.

7. The semiconductor device according to claim 1
   wherein a condition that a thickness of the first base layer is defined as L, a cell comprises the first base layer, the collector layer, the buffer layer, the second base layer, the emitter layer and the gate electrode, and a half size of the cell is defined W, the following relation is satisfied:

8×W>L.

8. The semiconductor device according to claim 1
   wherein the first base layer comprises a semiconductor substrate whose thickness is 70 µm or less.

9. The semiconductor device according to claim 1
   wherein the semiconductor device is an IGBT.

* * * * *